(12) United States Patent
Kim et al.

(10) Patent No.: US 8,227,326 B2
(45) Date of Patent: Jul. 24, 2012

(54) LASER CRYSTALLIZATION OF AMORPHOUS SILICON LAYER

(75) Inventors: Kwang-Hae Kim, Yongin (KR); Moo-Jin Kim, Yongin (KR)

(73) Assignee: Samsung Mobile Display Co., Ltd. (KR)

( * ) Notice: Subject to any disclaimer, the term of this patent is extended or adjusted under 35 U.S.C. 154(b) by 0 days.

(21) Appl. No.: 12/970,580

(22) Filed: Dec. 16, 2010

(65) Prior Publication Data

US 2011/0151601 A1  Jun. 23, 2011

(30) Foreign Application Priority Data

Dec. 21, 2009 (KR) .................. 10-2009-0128331

(51) Int. Cl.
*H01L 21/20* (2006.01)
(52) U.S. Cl. ................ 438/486; 438/487; 257/E21.133; 257/E21.379
(58) Field of Classification Search .......... 438/486–487; 257/E21.133, E21.379
See application file for complete search history.

(56) References Cited

U.S. PATENT DOCUMENTS

| | | | |
|---|---|---|---|
| 2002/0086468 A1* | 7/2002 | Kim et al. | 438/156 |
| 2003/0030052 A1* | 2/2003 | Oka et al. | 257/65 |
| 2003/0047280 A1* | 3/2003 | Takayama et al. | 156/344 |
| 2005/0239240 A1* | 10/2005 | Ohtani et al. | 438/166 |
| 2006/0131583 A1* | 6/2006 | Ohtani et al. | 257/59 |
| 2006/0286780 A1 | 12/2006 | Jang et al. | |
| 2007/0054499 A1 | 3/2007 | Jang et al. | |
| 2007/0096208 A1* | 5/2007 | Lee et al. | 257/347 |
| 2008/0100228 A1 | 5/2008 | Park | |
| 2008/0153214 A1 | 6/2008 | Jung et al. | |

FOREIGN PATENT DOCUMENTS

| | | |
|---|---|---|
| KR | 100618614 | 9/2006 |
| KR | 2007-0064079 A | 6/2007 |
| KR | 102007-0081218 A | 8/2007 |
| KR | 102008-0004232 A | 1/2008 |
| KR | 2008-0037192 A | 4/2008 |
| KR | 2008-0058897 | 6/2008 |
| KR | 2009-0069542 A | 7/2009 |

* cited by examiner

*Primary Examiner* — Kevin Parendo
(74) *Attorney, Agent, or Firm* — Knobbe Martens Olson & Bear LLP (57) ABSTRACT

A crystallization method, a method of manufacturing a thin-film transistor, and a method of manufacturing a display device are provided. The crystallization method includes: forming a backup amorphous silicon layer on a substrate, forming nickel particles on the backup amorphous silicon layer, converting the backup amorphous silicon layer into an amorphous silicon layer by thermally processing the backup amorphous silicon layer so as to diffuse the nickel particles throughout said backup amorphous silicon layer; and irradiating the amorphous silicon layer with energy from a laser.

9 Claims, 6 Drawing Sheets

LASER CRYSTALLIZATION OF AMORPHOUS SILICON LAYER

CROSS-REFERENCE TO RELATED APPLICATIONS

This application claims the benefit of Korean Patent Application No. 10-2009-0128331, filed on Dec. 21, 2009, in the Korean Intellectual Property Office, the disclosure of which is incorporated herein in its entirety by reference.

BACKGROUND

1. Field

The present field relates to a crystallization method for improving characteristics of a crystallized thin-film, a method of manufacturing a thin-film transistor (TFT), and a method of manufacturing a display device.

2. Description of the Related Technology

A poly-silicon film used in display devices, such as an organic light-emitting display (OLED) device or a liquid crystal display (LCD) device, is generally formed by irradiating an amorphous-silicon layer using a laser. An active layer formed of a poly-silicon film with large grain size generally improves the electrical characteristics of the active layer. However, there is a limit on increasing the grain size of the poly-silicon layer by crystallizing an amorphous silicon layer into the poly-silicon film by irradiation from a laser. The laser, by its energy, generally deforms the active layer and a substrate below the active layer. This limit in turn limits the improvement of the electrical characteristics of a crystallized thin-film.

SUMMARY OF CERTAIN INVENTIVE EMBODIMENTS

Embodiments of the present invention provide a crystallization method for improving characteristics of a crystallized thin-film.

Other embodiments provide a method of manufacturing a thin-film transistor (TFT) using the crystallization method.

Other embodiments provide a method of manufacturing a display device using the crystallization method.

One aspect is a crystallization method including: forming a backup amorphous silicon layer on a substrate, forming nickel particles on the backup amorphous silicon layer, converting the backup amorphous silicon layer into an amorphous silicon layer by thermally processing the backup amorphous silicon layer so as to diffuse the nickel particles throughout said backup amorphous silicon layer, and irradiating the amorphous silicon layer with energy from a laser.

Another aspect is a crystallization method including: forming a temporary amorphous silicon layer on a substrate, sputtering nickel particles on the temporary amorphous silicon layer, converting the temporary amorphous silicon layer into a permanent amorphous silicon layer by thermally processing the temporary amorphous silicon layer so as to diffuse the nickel particles throughout the temporary amorphous silicon layer, and irradiating the permanent amorphous silicon layer with a low-energy laser.

Another aspect is a method of fabricating a thin-film transistor, including: forming a temporary amorphous silicon layer on a substrate, forming nickel particles on the temporary amorphous silicon layer by atomic layer deposition, converting the temporary amorphous silicon layer into a permanent amorphous silicon layer by diffusing the nickel particles by thermally processing the temporary amorphous silicon layer, irradiating the amorphous silicon layer with a low-energy laser to form an active layer, and forming a gate electrode insulated from the active layer, and a source electrode and a drain electrode that are electrically connected to the active layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN INVENTIVE EMBODIMENTS

Hereinafter, a crystallization method, a method of manufacturing a thin-film transistor (TFT), and a method of manufacturing a display device will be described below in more detail with reference to the accompanying drawings. In the description below, shapes, sizes, ratios, angles, numbers, operations, and the like shown in the accompanying drawings are merely examples and may vary in other embodiments. Like reference numerals generally denote like elements throughout the drawings and description. Terms such as "including," "having," "consist of" are generally intended to indicate a plurality of components unless the terms are used with the term "only". An expression used in the singular may denote the expression in the plural. Variations are possible in relation to descriptions regarding numbers, shapes, size comparisons, position relationships when the descriptions are given without the terms "about," "substantially," "relatively," or the like. Terms such as "after," "before," "next," "and then," "here," "following" shall not be understood as limiting chronological positions. Where a position relationship between two items is described with the terms "on," "on the top of," or the like, one or more items may be interposed between the two items unless a description is given with the term "directly". Descriptions include any and all combinations of one or more of the associated listed items when the items are described by using the conjunctive term "or," "and/or," or the like, whereas descriptions include independent items only when the items are described by using the term 'or one of.'

FIGS. 1A through 1E illustrate sectional views of a crystallization method according to an embodiment of the present invention.

Figure 1A:
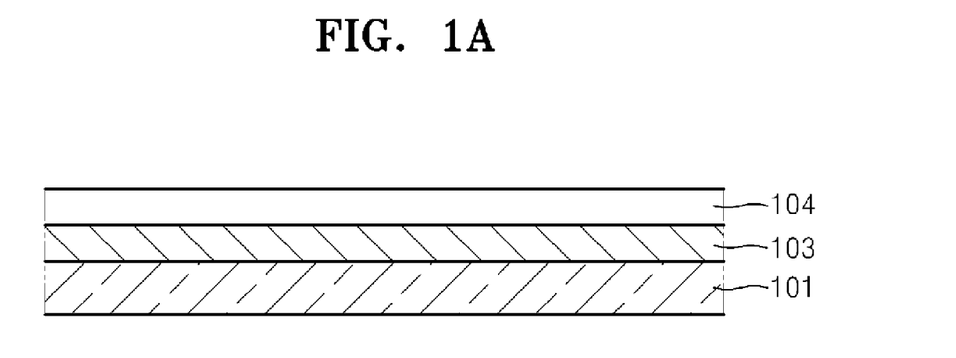
FIGS. 1A through 1E illustrate sectional views of a crystallization method according to an embodiment of the present invention.

Referring to FIG. 1A, a buffer layer 103 is formed on a substrate 101, and a backup amorphous silicon (a-Si) layer 104 is formed on the buffer layer 103.

In some embodiments, the substrate 101 is formed of a transparent glass material including silicon Si. In other embodiments, the substrate 101 may be formed of a transparent plastic material, which may in turn be formed of an insulating organic material. Examples of insulating organic materials include polyethersulphone (PES), polyacrylate (PAR), polyetherimide (PEI), polyethyelene napthalate (PEN), polyethyelene terepthalate (PET), polyphenylene sulphide (PPS), polyarylate, polyimide, polycarbonate (PC), cellulose triacetate (TAC), cellulose acetate propionate (CAP), and combinations thereof.

In yet other embodiments, the substrate 101 may be formed of a metal. In such embodiments, the substrate 101 may include iron (Fe), chromium (Cr), manganese (Mn), nickel (Ni), titanium (Ti), molybdenum (Mo), stainless steel (SUS), a Invar alloy, a Inconel alloy, a Kovar alloy, or combinations thereof. In one embodiment, the substrate 101 may be formed of foil.

In some embodiments, the buffer layer 103 is formed on the substrate 101 to substantially planarize the top surface of the substrate 101 and block permeation of impurities into the substrate 101. The buffer layer 103 may be formed of a silicon oxide ($SiO_2$) and/or a silicon nitride ($SiN_x$).

In some embodiments, the backup amorphous Si layer 104 is formed on the substrate 101. The backup amorphous Si layer 104 may be formed by using various methods, such as for example chemical vapor deposition (CVD).

Figure 1B:
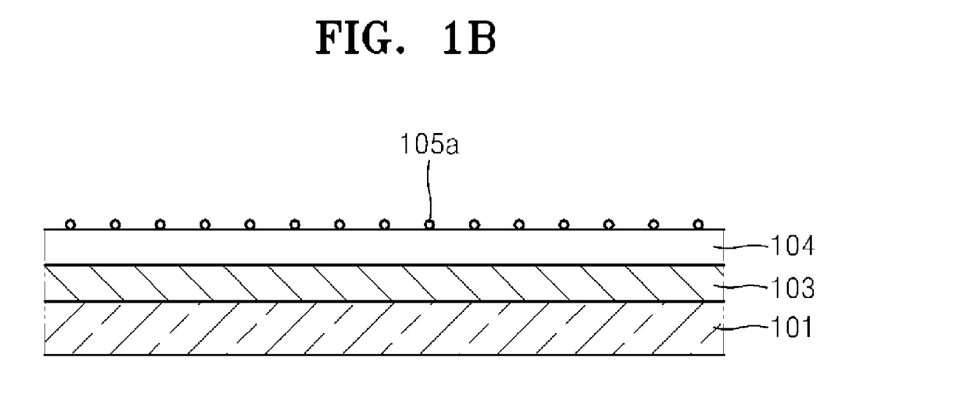

Referring to FIG. 1B, Ni particles 105a are formed on the backup amorphous Si layer 104. The Ni particles 105a may be formed by using various methods such as for example atomic layer deposition (ALD) or sputtering. The Ni particles 105a may be formed on the backup amorphous Si layer 104 with a desired surface density.

Due to the characteristics of processes and equipment used for forming the Ni particles 105a, it would generally be difficult to precisely control the surface density of the Ni particles 105a to achieve a surface density of less than $10^{12}$ atoms/cm$^2$. If the surface density of the Ni particles 105a were greater than $10^{14}$ atoms/cm$^2$, electrical characteristics of a thin-film transistor (TFT) or a display device having an active layer formed by crystallizing the backup amorphous Si layer 104 would be deteriorated. Therefore, in some embodiments, the Ni particles 105a are arranged on the backup amorphous Si layer 104 to have a surface density of from about $10^{12}$ atoms/cm$^2$ to about $10^{14}$ atoms/cm$^2$.

Figure 1C:
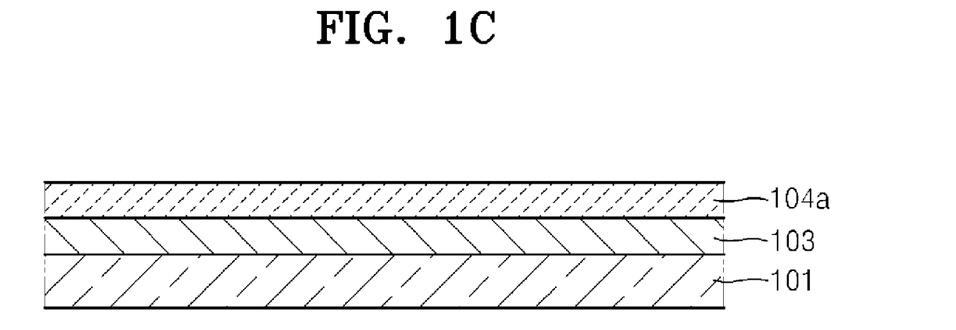

Referring to FIG. 1C, a thermal process is performed so that the Ni particles 105a shown in FIG. 1B are diffused. As a result, an amorphous Si layer 104a including Ni is formed. In some embodiments, the thermal process is performed at a temperature between about 280° C. and about 330° C.

Generally, when the thermal process is performed at a temperature below about 280° C., the Ni particles 105a are not completely diffused throughout the amorphous Si layer 104. Also, generally, when the thermal process is performed at a temperature above about 330° C., the amorphous Si layer 104 is crystallized due to the Ni particles 105a, and thus the sizes of grains of crystals become smaller than desired, and poly-silicon having grains of desired sizes cannot be formed even by performing laser irradiation later on.

Figure 1D:
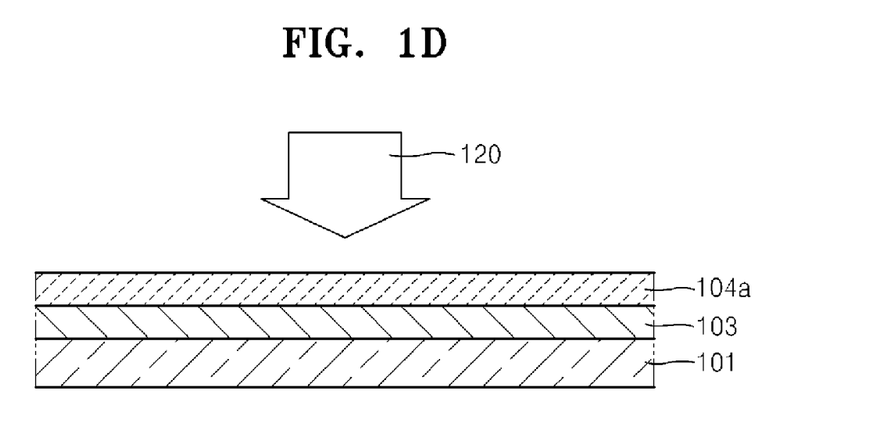
Figure 1E:
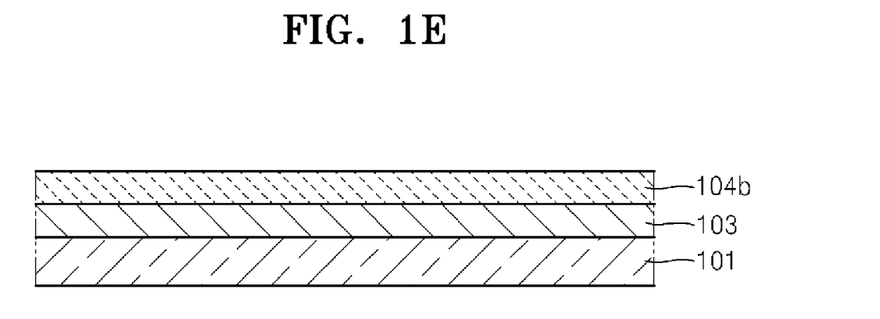

Referring to FIG. 1D, a laser irradiating device 120 provides laser energy. The laser irradiates the amorphous Si layer including Ni 104a. The laser used generally has sufficient energy to crystallize the amorphous Si layer including Ni 104a. In certain embodiments, the energy of the laser can be less than the energy of a laser used in a process for crystallizing an amorphous Si layer without the formation of Ni particles. As shown in FIG. 1D, a poly-crystal Si layer 104b is formed by performing the laser crystallization.

According to one embodiment of the crystallization method, the Ni particles 105a are formed and thermally processed before laser irradiation, so that the Ni particles 105a are evenly diffused throughout the backup amorphous Si layer 104. Therefore, the Ni particles 105a work as seeds of crystal growth during laser irradiation, and thus a poly-crystal Si layer 104b with relatively large grains may be formed.

In embodiments where the thermal process is performed after the Ni particles 105a are formed, the thermal process temperature is adjusted so that the Ni particles 105a are effectively diffused. The poly-crystal Si layer 104b with relatively large grains may be formed by preventing reductions in size of grains by crystallizing the backup amorphous layer 104 before laser irradiation by adjusting the temperature for performing the thermal process.

The deterioration of electrical characteristics of a TFT employing the poly-crystal Si layer 104b may be prevented by adjusting the density of the Ni particles 105a. A suitable amount of the Ni particles 105a may be used, so that possible problems caused by the electro-conductive Ni particles 105a are prevented (e.g. leakage current).

Since the Ni particles 105a work as seeds of crystal growth, the energy of the laser used for crystallization may be reduced. The use of reduced laser energy during crystallization helps prevent deformation of the substrate 101 and damage to the poly-crystal Si layer 104b.

Embodiments of the crystallization method may be applied to various fields. For example, embodiments may be used in a method of fabricating a TFT and in a method of manufacturing a display device. Detailed descriptions of embodiments of such methods will be given below.

Figure 2A:
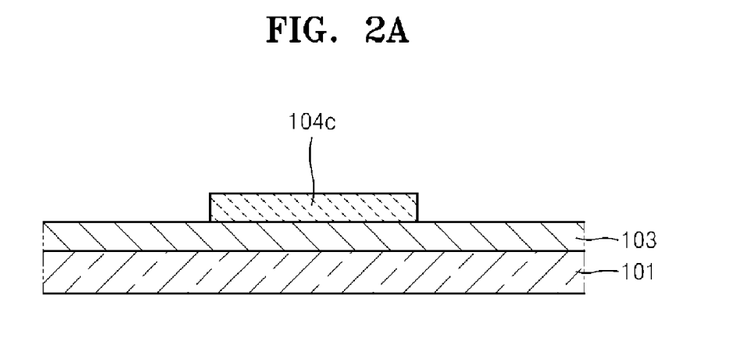
FIGS. 2A through 2C illustrate sectional views of a method of fabricating a thin film transistor (TFT), according to an embodiment of the present invention.
Figure 2B:
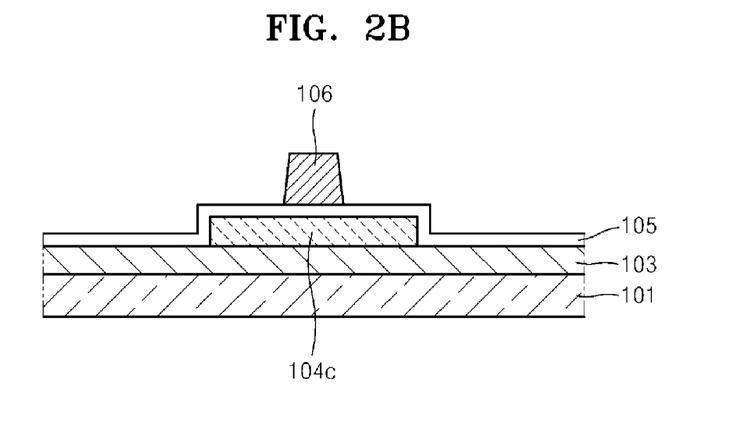
Figure 2C:
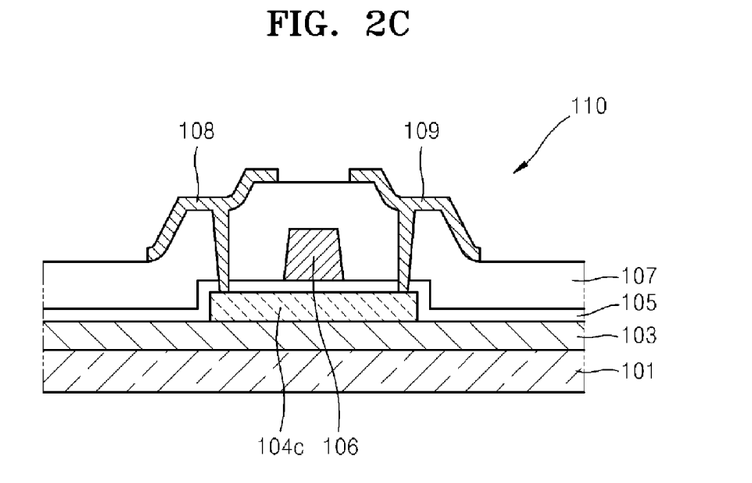

FIGS. 2A through 2C illustrate sectional views of a method of fabricating a thin-film transistor (TFT), according to an embodiment of the present invention. The embodiment of the crystallization method shown in FIGS. 1A through 1E may be used in an embodiment of a method of fabricating a TFT. Common descriptions are omitted.

Referring to FIG. 2A, an active layer 104c is formed by patterning the poly-crystal Si layer 104b into a predetermined shape. In some embodiments, the active layer 104c may be patterned using a photolithography method.

Referring to FIG. 2B, a gate insulation layer 105 and a gate electrode 106 are formed on the active layer 104c. The gate insulation layer 105 may be formed of any of various insulation materials, and insulates the gate electrode 106 from the active layer 104c. The gate electrode 106 may be formed of any of various metals and metal alloys. A source region and a drain region may be formed in the active layer 104c by doping the active layer 104c with impurities, by using the gate electrode 106 as a mask.

Referring to FIG. 2C, an interlayer insulation layer 107 is formed to cover the gate electrode 106. A source electrode 108 and a drain electrode 109 are formed on the top surface of the interlayer insulation layer 107, where the source electrode 108 and the drain electrode 109 connect to the source region and the drain region of the active layer 104c, respectively.

In the embodiment shown in FIG. 2A-2C, the TFT 110 is a top gate type TFT. Other embodiments with the TFT employing a poly-crystal Si layer as an active layer are also possible.

In one embodiment of a method of fabricating a TFT according, crystallization is performed by irradiating a laser to an amorphous Si layer, to form the active layer 104c. Ni particles are formed and thermally processed before laser irradiation, so that the Ni particles are evenly diffused throughout the amorphous Si layer. Therefore, the Ni particles work as seeds of crystal growth during crystallization via laser irradiation, and thus an active layer 104c with relatively large grains may be formed. The deterioration of electrical characteristics of the TFT 110 due to the deterioration of the active layer 104c may be prevented by adjusting the density of the Ni particles 105a.

Figure 3A:
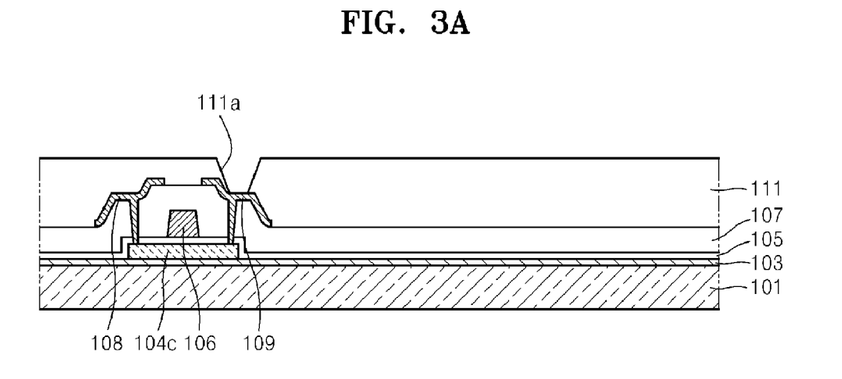
FIGS. 3A and 3B illustrate sectional views of a method of manufacturing a display device, according to an embodiment of the present invention.
Figure 3B:
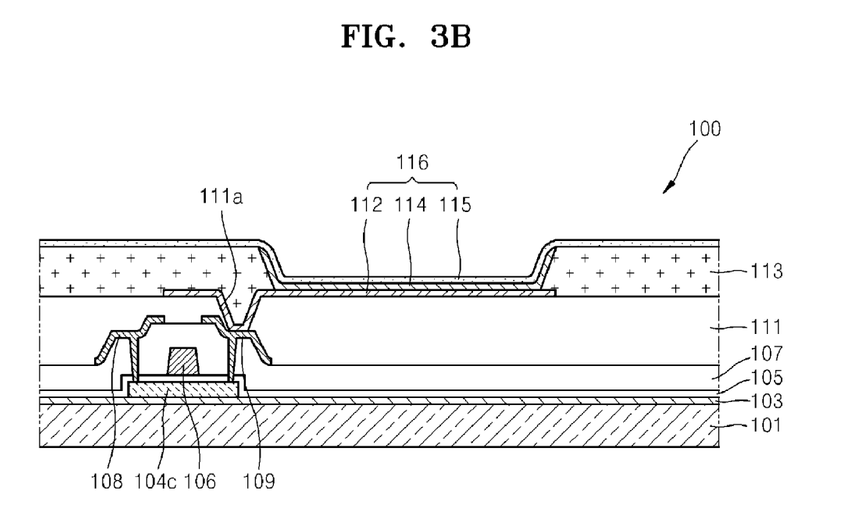

FIGS. 3A and 3B illustrate sectional views of a method of manufacturing a display device, according to an embodiment of the present invention. One embodiment of the method of manufacturing a display device uses the embodiments of the crystallization method and the method of fabricating a TFT described above. Therefore, for convenience, descriptions that are the same as the descriptions given above with reference to FIGS. 1A through 1E and 2A through 2C are omitted. In one embodiment, an organic light-emitting display (OLED) device is the display device. In other embodiments, other display devices; e.g. a liquid crystal display (LCD) devices may be fabricated.

Referring to FIG. 3A, a planarization layer 111 with via hole 111a is formed on the source electrode 108 and the drain electrode 109. The planarization layer 111 may be formed of an insulation material including organic substances or inorganic substances.

Referring to FIG. 3B, an organic light-emitting element 116 is formed to be electrically connected to the drain electrode 109. The organic light-emitting element 116 includes a first electrode 112, an intermediate layer 114 including an organic light-emitting layer, and a second electrode 115. The first electrode 112 may be formed on the planarization layer 111 as a transparent electrode or a reflective electrode. In embodiments where the first electrode 112 is formed as a transparent electrode, the first electrode 112 may be formed of ITO, IZO, ZnO, $In_2O_3$, etc. In embodiments where the first electrode 112 is formed as a reflective electrode, the first electrode 112 may be formed by providing a reflective layer, which is formed of silver (Ag), magnesium (Mg), aluminum (Al), platinum (Pt), lead (Pd), gold (Au), nickel (Ni), niobium (Nd), iridium (Ir), chrome (Cr), or an alloy thereof, and forming another layer, which is formed of ITO, IZO, ZnO, or $In_2O_3$, on the reflective layer. In such embodiments, ITO, IZO, ZnO, and $In_2O_3$ may be used alone or mixed with other materials. Furthermore, Ag, Mg, Al, Pt, Pd, Au, Ni, Nd, Ir, Cr, and an alloy thereof may be used alone or mixed with other materials. The first electrode 112 contacts either the source electrode 108 or the drain electrode 109 via the via hole 111a.

A pixel-defining layer (PDL) 113 is formed on the first electrode 112. The PDL 113 may be formed of an organic material or an inorganic material. The PDL 113 is formed to expose a portion of the first electrode 112.

The intermediate layer 114 is formed to contact the exposed portion of the first electrode 112. The intermediate layer 114 includes an organic light-emitting layer. The intermediate layer 114 emits light as the first electrode 112 and the second electrode 115 are electrically driven. The intermediate layer 114 is formed of an organic material. In embodiments where the organic light-emitting layer of the intermediate layer 114 is formed of an organic monomer material, a hole transport layer (HTL) and a hole injection layer (HIL) are stacked on the organic light-emitting layer toward the first electrode 112, and an electrode transport layer (ETL) and an electrode injection layer (EIL) are stacked on the organic light-emitting layer toward the second electrode 115. Various other layers may be stacked in some embodiments. The intermediate layer 114 may be formed of any of various materials including copper phthalocyanine (CuPc), N,N'-Di(naphthalene-1-yl)-N,N'-diphenyl-benzidine (NPB), and tris-8-hydroxyquinoline aluminum (Alq3).

In embodiments where the organic light-emitting layer of the intermediate layer 114 is formed of an organic polymer material, only a HTL may be stacked on the organic light-emitting layer toward the first electrode 112. The polymer hole transport layer may be formed of poly-(2,4)-ethylene-dihydroxy thiophene (PEDOT) or polyaniline (PANI) and may be formed on the top surface of first electrode 112 by using a method, such as inkjet printing or spin coating. A polymer organic light-emitting layer may be formed of PPV, soluble PPV's, Cyano-PPV, or polyfluorene, and a color pattern thereof may be formed by using a general method, such as inkjet printing, spin coating, or thermal transfer using a laser.

The second electrode 115 is formed on the intermediate layer 114. The second electrode 115 may be formed by depositing a metal with a low work function, e.g. Ag, Mg, Al, Pt, Pd, Au, Ni, Nd, Ir, Ci, Li, Ca, or an alloy thereof, and depositing a transparent electro-conductive material, e.g. ITO, IZO, ZnO, or $In_2O_3$, thereon. A sealing member (not shown) may be disposed on the second electrode 115. The sealing member is formed to protect the intermediate layer 114 and other layers from moisture or oxygen from outside, and is formed of a transparent material. The sealing member may be formed of a glass or a plastic, or may have a stacked structure of a plurality of organic layers and a plurality of inorganic layers.

FIGS. 4A through 4D illustrate sectional views of a method of manufacturing a display device, according to another embodiment of the present invention.

Figure 4A:
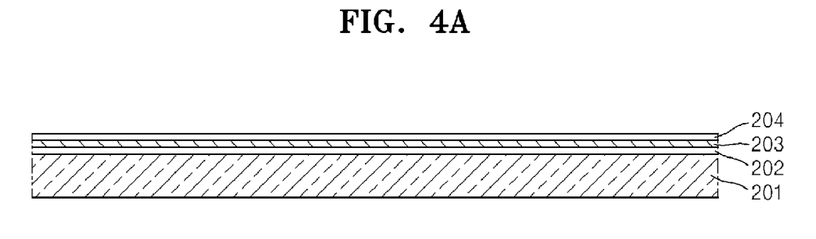
FIGS. 4A through 4D illustrate sectional views of a method of manufacturing a display device, according to another embodiment of the present invention.

Referring to FIG. 4A, a substrate 202, a buffer layer 203, and a backup amorphous Si layer 204 are sequentially formed on a base member 201. The base member 201 may be formed of a transparent glass.

The substrate 202 is formed of a flexible material. The substrate 202 may include organic materials. Examples of organic materials include polyethersulphone (PES), polyacrylate (PAR), polyetherimide (PEI), polyethylene napthalate (PEN), polyethylene terepthalate (PET), polyphenylene sulfide (PPS), polyallylate, polyimide, polycarbonate (PC), cellulose tri acetate (TAC), and cellulose acetate propionate (CAP). Each of the organic materials stated above may be used alone or mixed with other materials.

The buffer layer 203 may be formed on the top surface of the substrate 202 to planarize the top surface of the substrate 202 and to block the permeation of impurities to the substrate 202. The buffer layer 203 may be formed of $SiO_2$ and/or $SiN_x$. The backup amorphous Si layer 204 is formed on the buffer layer 203.

Figure 4B:
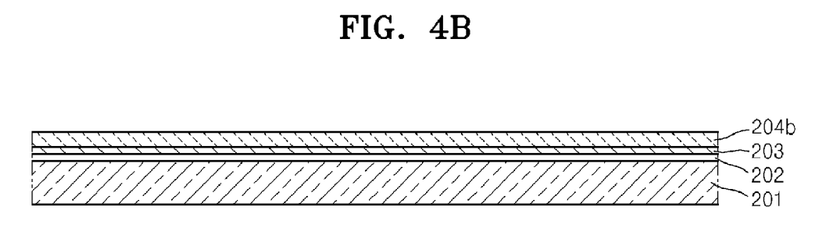

Referring to FIG. 4B, an amorphous Si layer is formed by diffusing nickel particles throughout the backup amorphous Si layer 204 and performing a thermal process thereon. A poly-crystal Si layer 204b is formed by crystallizing the amorphous Si layer by irradiating a laser on the amorphous Si layer, using the process described above with reference to FIGS. 1B through 1E.

The substrate 202 may include a plastic for flexibility, and thus the substrate 202 may be easily damaged by heat. However, during embodiments of the crystallization process, the Ni particles work as seeds of crystal growth, so that an amorphous Si layer is efficiently crystallized with reduced energy for the laser. Therefore, crystallization may be performed without deformation of the substrate 202.

Figure 4C:
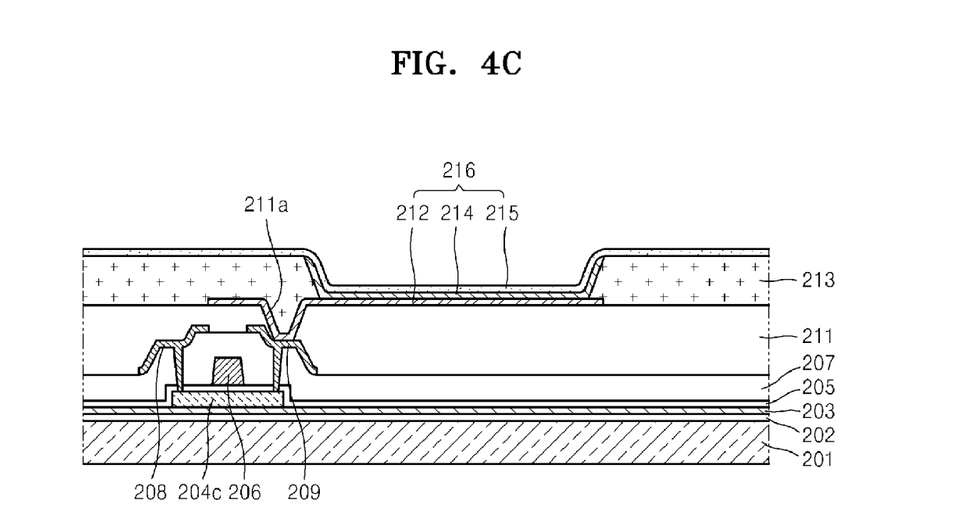

Referring to FIG. 4C, an active layer 204c is formed by patterning the poly-crystal Si layer 204b, and a gate insulation layer 205 and a gate electrode 206 are formed on the active layer 204c. An interlayer insulation layer 207 is formed to cover the gate electrode 206, and a source electrode 208 and a drain electrode 209 are formed on the top surface of the interlayer insulation layer 207.

A planarization layer 211 with a via hole 211a is formed on the source electrode 208 and the drain electrode 209. An organic light-emitting element 216 is formed to be electrically connected to the drain electrode 209. The organic light-emitting element 216 includes a first electrode 212, an intermediate layer 214 including an organic light-emitting layer, and a second electrode 215. The first electrode 212 is formed on the planarization layer 211. The first electrode 212 contacts either the source electrode 208 or the drain electrode 209 via the via hole 211a. A pixel-defining layer (PDL) 213 is formed on the first electrode 212. The PDL 213 is formed to expose a predetermined portion of the first electrode 212.

The intermediate layer 214 is formed to contact the exposed portion of the first electrode 212. The intermediate layer 214 includes the organic light-emitting layer. The second electrode 215 is formed on the intermediate layer 214. The intermediate layer 214 emits light as the first electrode 212 and the second electrode 215 are electrically driven.

A sealing member (not shown) may be disposed on the second electrode 215. The sealing member is formed to protect the intermediate layer 214 and other layers from moisture or oxygen from outside, and is formed of a transparent material. The sealing member may be formed of a glass or a plastic, or may have a stacked structure of a plurality of organic layers and a plurality of inorganic layers.

Figure 4D:
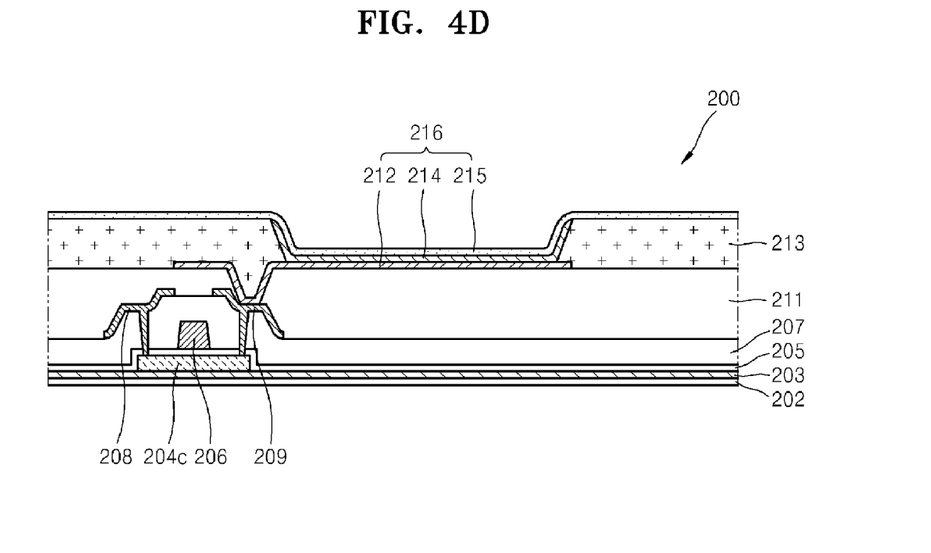

Referring to FIG. 4D, the base member 201 is peeled off, and thus the display device 200 is manufactured. The peeling-off operation is performed by applying a predetermined energy to the base member 201 using a laser device.

According to one embodiment, the substrate 202 may be formed to include flexible materials, and a flexible display device 200 may be formed.

Ni particles 105a are formed and are thermally processed to be evenly diffused throughout an amorphous Si layer during the formation of the active layer 204c. As a result, the Ni particles work as seeds of crystal growth during crystallization, and thus efficiency of the crystallization may be improved and the energy of a laser for crystallization may be reduced. Therefore, damage to the substrate 202 during crystallization may be prevented, and thus a flexible display device 200 may be manufactured.

According to embodiments of the present invention, the density of the nickel particles, which act as crystallization seeds, may be optimized to reduce future problems, e.g. leakage currents. By diffusing nickel at a relatively low temperature, damage due to thermal process at a high temperature may be reduced and poly-silicon having relatively large grains may be obtained.

While the present invention has been particularly shown and described with reference to certain exemplary embodiments, it will be understood by those of ordinary skill in the art that various changes in form and details may be made therein without departing from the spirit and scope of the present invention.

What is claimed is:

1. A crystallization method comprising:
forming a first amorphous silicon layer on a substrate;
forming nickel particles on the first amorphous silicon layer;
converting the first amorphous silicon layer into a second amorphous silicon layer by thermally processing the first amorphous silicon layer at a temperature between about 280° C. and about 330° C. so as to diffuse the nickel particles throughout said first amorphous silicon layer wherein the second amorphous layer remains amorphous; and
irradiating the second amorphous silicon layer with energy from a laser and thereby crystallizing the second amorphous silicon layer.

2. The crystallization method of claim 1, wherein forming nickel particles is performed by using sputtering or atomic layer deposition.

3. The crystallization method of claim 1, wherein the nickel particles are formed on the first amorphous silicon layer with a surface density between about $10^{12}$ atoms/cm$^2$ and about $10^{14}$ atoms/cm$^2$.

4. A method of fabricating a thin-film transistor, which comprises an active layer, a gate electrode insulated from the active layer, and a source electrode and a drain electrode that are electrically connected to the active layer, wherein the active layer is formed by the method of claim 1.

5. The method of claim 4, wherein the nickel particles are formed on the first amorphous silicon layer with a surface density between about $10^{12}$ atoms/cm$^2$ and about $10^{14}$ atoms/cm$^2$.

6. A method of manufacturing a display device which comprises a thin-film transistor and a device electrically connected to the thin-film transistor, said method comprising forming an active layer included in the thin-film transistor by the method of claim 1.

7. The method of claim 6, wherein the nickel particles are formed on the first amorphous silicon layer with a surface density between about $10^{12}$ atoms/cm$^2$ and about $10^{14}$ atoms/cm$^2$.

8. The method of claim 6, wherein the thin-film transistor is disposed on or over a substrate containing a flexible material.

9. The method of claim 8, wherein a base member is arranged on a surface of the substrate, wherein the surface is opposite to a second surface of the substrate, wherein the second surface faces the thin-film transistor, and the base member is peeled off after the device is formed on the thin-film transistor.

* * * * *

UNITED STATES PATENT AND TRADEMARK OFFICE
CERTIFICATE OF CORRECTION

PATENT NO. : 8,227,326 B2
APPLICATION NO. : 12/970580
DATED : July 24, 2012
INVENTOR(S) : Kwang-Hae Kim and Moo-Jin Kim Page 1 of 1

It is certified that error appears in the above-identified patent and that said Letters Patent is hereby corrected as shown below:

At column 2, line 55, please delete "or one of.""", and insert -- "or one of." --, therefor.

At column 3, line 1, please delete "polyethyelene napthalate", and insert -- polyethylene naphthalate --, therefor.

At column 3, line 2, please delete "polyethyelene terepthalate", and insert -- polyethylene terephthalate --, therefor.

At column 6, line 30-31, please delete "napthalate", and insert -- naphthalate --, therefor.

At column 6, line 31, please delete "terepthalate", and insert -- terephthalate --, therefor.

At column 6, line 32, please delete "polyallylate,", and insert -- polyarylate, --, therefor.

At column 6, line 33, please delete "tri acetate", and insert -- triacetate --, therefor.

Signed and Sealed this
Nineteenth Day of February, 2013

Teresa Stanek Rea
*Acting Director of the United States Patent and Trademark Office*